US006415384B1

(12) United States Patent
Dave

(10) Patent No.: US 6,415,384 B1
(45) Date of Patent: Jul. 2, 2002

(54) HARDWARE/SOFTWARE CO-SYNTHESIS OF DYNAMICALLY RECONFIGURABLE EMBEDDED SYSTEMS

(75) Inventor: Bharat P. Dave, Howell, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/393,535

(22) Filed: Sep. 10, 1999

Related U.S. Application Data

(60) Provisional application No. 60/106,220, filed on Oct. 30, 1998.

(51) Int. Cl.⁷ .......................... G06F 9/00; G06F 15/177
(52) U.S. Cl. ........................................ 713/100; 713/1
(58) Field of Search ..................................... 713/1, 100

(56) References Cited

U.S. PATENT DOCUMENTS

| | | | |
|---|---|---|---|
| 4,885,684 A | | 12/1989 | Austin et al. |
| 5,202,987 A | | 4/1993 | Bayer et al. |
| 5,210,872 A | | 5/1993 | Ferguson et al. |
| 5,418,953 A | | 5/1995 | Hunt et al. |
| 5,452,461 A | | 9/1995 | Umekita et al. |
| 5,590,323 A | | 12/1996 | Kartalopoulos |
| 5,742,821 A | | 4/1998 | Prasanna |
| 5,768,594 A | | 6/1998 | Blelloch et al. |
| 5,781,787 A | | 7/1998 | Shafer et al. |
| 5,870,588 A | | 2/1999 | Rompaey et al. |
| 5,954,792 A | * | 9/1999 | Balarin ................. 709/102 |
| 5,961,599 A | * | 10/1999 | Kalavade et al. ........... 709/224 |
| 5,968,115 A | * | 10/1999 | Trout ..................... 709/107 |

OTHER PUBLICATIONS

"A Global Criticality/Local Phase Driven Algorithm for the Constrained Hardware/Software Partitioning Problem", by Asawaree Kalavade and Edward A. Lee; 1994 IEEE, pp. 42–48.

"Algorithms for Scheduling Hard Aperiodic Tasks in Fixed–Priority Systems using Slack Stealing", by Sandra R. Thuel and John P. Lehoczky, 1994 IEEE, pp. 22–33.

"Allocation of Periodic Task Modules with Precedence and Deadline Constraints in Distributed Real–Time Systems",by Chao–Ju Hou and Kang G. Shin, 1992 IEEE Computer Society Technical Committee on Real–Time Systewms, 11 pages.

"An Efficient Algorithm for Graph Isomorphism", by D.G. Corneil and C.C. Gotlieb, Journal of the Associatioin for Computing Machinery, vol. 17, No. 1, Jan. 1970, pp. 51–64.

(List continued on next page.)

Primary Examiner—Dennis M. Butler
(74) Attorney, Agent, or Firm—Mendelsohn & Associates, PC

(57) ABSTRACT

Hardware-software co-synthesis is the process of partitioning an embedded system specification into hardware and software modules to meet performance, power, and cost goals. Embedded systems are generally specified in terms of a set of acyclic task graphs. According to one embodiment, a co-synthesis algorithm, called CRUSADE, starts with periodic task graphs with real-time constraints and produces a low-cost heterogeneous distributed embedded system architecture meeting these constraints. CRUSADE addresses the co-synthesis of dynamically reconfigurable architectures. Fault-tolerant distributed embedded systems can offer high performance as well as dependability (reliability) and availability to meet the needs of critical real-time applications. The present invention can be easily extended to address the needs of fault-tolerant systems. In order to establish its effectiveness, CRUSADE has been successfully applied to several large real-life examples from mobile communication network base station, video distribution router, and telecom embedded systems.

15 Claims, 4 Drawing Sheets

OTHER PUBLICATIONS

"An Optimal Algorithm for Scheduling Soft–Aperiodic Tasks in Fixed–Priority Preemptive Systems", by John P. Lehoczky and Sandra Ramos–Thuel, 1992 IEEE Computer Society Technical Committe on Real–Time Systems, 15 pages.

"Aperiodic Servers in a Deadline Scheduling Environment", by T.M. Ghazalie and T.P. Baker; Realtime System 9, (1995), pp. 31–67.

"Architectural Support For Designing Fault–Tolerant Open Distributed Systems", by Salim Hariri, Alok Choudhary, and Behcet Sarikaya, 1992 IEEE.

"Calculating the Maximum Execution Time on Real–Time Programs", by P. Puschner and C.H. Koza, The Journal of Real–Time Systems, 1,(1989), pp. 159–176.

"Communication Synthesis for Distributed Embedded Systems", by Ti–Yen Yen and Wayne Wolf, Proceedings of International Conference on Computer–Aided Design, pp. 288–294, Nov. 1995.

"Computer–Aided Hardware–Software Codesign", by Giovanni De Micheli, Aug. 1994 IEEE Micro Chips, Systems, Software, and Applications, 8 pages.

"Configuration–Level Hardware/Software Partitioning for Real–Time Embedded Systems", by Joseph G. D'Ambrosio and Xiaobo (Sharon) Hu, 1994 IEEE, pp. 34–41.

"Constrained Software Generation for Hardware–Software Systems", by Rajesh K. Gupta and Giovanni De Micheli, 1994 IEEE, pp. 56–63.

"Dynamic Critical–Path Scheduling: An Effective Technique for Allocating Task Graphs to Multiprocessors", by Yu–Kwong Kwok, Ishfaq Ahmad, IEEE Transactions on Parallel and Distributed Systems, vol. 7, No. 5, May 1996, 17 pages.

"Efficient Scheduling Algorithms for Real–Time Multiprocessor Systems", by Krithi Ramamritham, John A. Stankovic, and Perng–Fei Shiah, IEEE Transactions on Parallel and Distributed, vol. 1, No. 2, Apr. 1990, 12 pages.

"Exploiting Unused Periodic Time for Aperiodic Service Using the Extended Priority Exchange Algorithm", by Brinkley Sprunt, John Lehoczky, and Lui Sha, IEEE Computer Society Real–Time Systems Symposium, Dec. 6–8, 1988, pp. 251–258.

"Hardware–Software Co–Design of Embedded Systems", by Wayne H. Wolf, Proceedings of the IEEE, vol. 82, No. 8, Jul. 1994, pp. 967–989.

"A Hardware–Software Codesign Methodology for DSP Applications", by Asawaree Kalavade and Edward A. Lee, Sep. 1993 IEEE Design & Test of Computer, pp. 16–28.

"Hardware–Software Cosynthesis for Digital Systems", by Rajesh K. Gupta and Giovanni De Michell, Sep. 1993, IEEE Design & Test of Computers, pp. 29–40.

A Hardware/Software Partitioner Using a Dynamically Determined Granularity, by Jörg Henkel and Rolf Ernst, DAC 97–6/97 Anaheim, CA, 3 pages.

"Hill–Climbing Heuuristics for Optical Hardware Dimensioning and Software Allocation in Fault–Tolerant Distributed Systems", by Fausto Distant and Vincenzo Piuri, IEEE Transactions on Reliability, vol. 38, No. 1, Apr. 1989, pp. 28–39.

"Load Sharing with Consideration of Future Task Arrivals in Heterogeneous Distributed Real–Time Systems", by Chao–Ju Hou and Kang G. Shin, 1991 IEEE Real–Time Computer Laboratory, pp. 94–103.

"Low Overhead Fault Tolerance for Real–Time Distributed Systems: Application to Hardware/Software Co–Synthesis of Embedded Systems", by Santhanam Srinivasan and Niraj K. Jha, 31 pages, corresponding to conference paper presented Sep. 1995 in Proc. European Design Automation Conf.

"On–Line Scheduling of Hard Deadline Aperiodic Tasks in Fixed–Priority Systems", by Sandra Ramos–Thuel and John P. Lehoczky, 1993 IEEE, pp. 160–171.

"On–Line Scheduling of Real–Time Tasks", by Kwang S. Hong and Joseph Y.–T. Leung, 1988 IEEE Computer Society, pp. 244–250.

On the Complexity of Fixed–Priority Scheduling of Periodic, Real–Time Tasks, by Joseph Y.–T. Leung and Jennifer Whitehead, 1982 North–Holland Publishing Company, Performance Evaluaion 2 (1982), pp. 237–250.

"On Non–Preemptive Scheduling of Periodic and Sporadic Tasks", by Kevin Jeffay, Donald F. Stanat, and Charles U. Martel, Dec. 1991 IEEE Twelfth Real–Time Systems Symposium, pp. 129–139.

Optimal Algorithms for Synthesis of Reliable Application–Specific Heterogeneous Multiprocessor, by Aurobindo Dasgupta and Ramesh Karri, IEEE Transactions on Reliability, vol. 44, No, 4, Dec. 1995, pp. 603–613.

"Optimal Priority Assignment for Aperiodic Tasks With Firm Deadlines in Fixed Priority Pre–Emptive Systems", by Robert Davis and Alan Burns, Information Processing Letters, vol. 53, No. 5, Mar. 1995, pp. 249–254.

"Performance Estimation for Real–Time Distributed Embedded Systems", by Ti–Yen Yen and Wayne Wolf, Dept. of Electrical Engineering, Princeton University, pp. 1–6, Proc. of Intl. Conf. on Computer Design, Oct. 1995.

"Process Partitioning for Distributed Embedded Systems", by Junwei Hou and Wayne Wolf, Sep. 1996 IEEE, pp. 70–75.

"Program Implementation Schemes for Hardware–Software", by Rajesh K. Gupta, Claudionor N. Coelho Jr., and Giovanni De Micheli, Jan. 1994 IEEE, vol. 27, No. 1, pp. 48–55.

"Rate–Monotonic Analysis for Real–Time Industrial Computing", by Mark H. Klein et al., Jan. 1994, vol. 27, No. 1 pp. 24–33.

"Replication and Allocation of Task Modules in Distributed Real–Time Systems", by Chao–Ju Hou and Kang G. Shin, Jun. 1994, IEEE Computer Society, pp. 26–35.

"Scheduling Algorithms and Operating Systems Support for Real–Time Systems", by Krithi Ramamritham and John A. Stankovic, Proceedings of the IEEE, vol. 82, No. 1, Jan. 1994, pp. 55–67.

"Scheduling Parallel I/O Operations in Multiple Bus Systems", by Ravi Jain et al., Journal of Parallel and Distributed Computing 16, 1992, pp. 352–362.

"Scheduling Periodically Occuring Tasks on Multiple Processors", by Eugene L. Lawler and Charles U. Martel, Information Processing Letters, vol. 12, No. 1, Feb. 1981.

"Scheduling Slack Time in Fixed Priority Pre–emptive Systems", by R.I. Davis, K.W. Tindell, and A. Burns, Dec. 1993 IEEE Real–Time Systems Symposium, pp. 222–231.

"Scheduling Tasks with Resource Requirements in Hard Real–Time Systems", by Wei Zhao et al., IEEE Transactions on Software Engineering, vol. SE–13, No. 5, May 1987, pp. 564–577.

"Sensitivity–Driven Co–Synthesis of Distributed Embedded Systems", by Ti–Yen Yen and Wayne Wolf, International Symposium on System Synthesis, 1995, pp. 1–6.

"SIERA: a Unified Framework for Rapid–Prototyping of System–Level Hardware and Software", by Mani B. Srivastava and Robert W. Brodersen, IEEE Transactions on Computer–Aided Design of Integrated Circuits and Systems, vol. 14, No. 6, Jun. 1995, pp. 676–693.

"SOS: Synthesis of Application–Specific Heterogeneous Multiprocessor Systems", by Shiv Prakash and Alice C. Parker, Journal of Parallel and Distributed Computing, vol. 16, No. 4, pp. 338–351 (1992).

"SpecCharts: A VHDL Front–End for Embedded Systems", by Frank Vahid, Sanjiv Narayan, and Daniel D. Gajski, IEEE Transactions on Computer–Aided Design of Integrated Circuits and Systems, vol. 14, No. 6, Jun. 1995, pp. 694–706.

"Synthesis of Application Specific Instruction Sets", Ing–Jer Huang and Alvin M. Despain, IEEE Transactions of Computer–Aided Design of Integrated Circuits and Systems, vol. 14, No. 6, Jun. 1995, pp. 663–675.

"System–Level Synthesis of Low–Power Hard Real–Time Systems", by Darko Kirovski and Miodrag Potkonjak, DAC97, 6/97, Anaheim, CA, 6 pages.

"Task Allocation of Maximizing Reliability of Distributed Computer Systems", by Sol M. Shatz, Jia–Ping Wang, and Masanori Goto, IEEE Transactions on Computers, vol. 41, No. 9, Sep. 1992, pp. 1156–1160.

"TBFT: A Task–Based Fault Tolerance Scheme for Distributed Systems", by Shalini Yajnik, Santhanam Srivivasan, Niraj K. Jha, Seventh International Conference on Parallel and Distributed Computing Systems, Oct. 1994, 21 pages.

"TigerSwitch: A Case Study in Embedded Computing System Design", by Wayne Wolf, Andrew Wolfe, Steve Chinatti, Ravi Koshy, Gary Slater, and Spencer Sun, 0–8186–6315–4/94, 1994 IEEE, pp. 89–96.

"Dynamic Scheduling of Real–Time Aperiodic Tasks on Multiprocessor Architectures,", by Babak Hamidzadeh and Yacine Atif, 1996 IEEE, Proceedings of the 29th Annual Hawaii International Conference on System Science, pgs.

"Hardware–Software Co–Synthesis of Fault–Tolerant Real–Time Distributed Embedded Systems," by Santhanam Srinivasan and Niraj K. Jha, 1995 IEEE, Design Automation Conference 1995, with EURO–VHDL, Proceedings EURO–DAC '95, European.

"An Approach to the Adaptation of Estimated Cost Parameters in the COSYMA System," by D. Hermann et al., Proceedings of the Third International Workshop on Hardware/Software CoDesign, 1994, pp. 100–107.

"Architectural Partitioning for System Level Synthesis of Integrated Circuits," by E. Lagnese et al., IEEE Computer Aided Design of Integrated Circuits and Systems, 1991, pp. 847–860.

"CoWare–A Design Environment for Heterogeneous Hardware/Software Systems," by Van Rompaey et al., Design Automation Conference, 1996, pp. 252–257.

"Fast Timing Analysis for Hardware–Software Co–Synthesis," by R. Ernst et al., VLSI in Computes and Processors, 1993, pp. 452–457.

"Hardware–Software Cosynthesis for Microcontrollers," by R. Ernst et al., IEEE Design & Test of Computers, 12/93, pp. 64–75.

"Synthesis and Analysis of an Industrial Embedded Microcontroller," by Ing–Jer Huang et al., Design Automation Conference, 1997, pp. 151–156.

"Embedded Architecture Co–Synthesis and System Integration", by Bill Lin et al., Hardware/Software Co–Design, Mar. 1996 IEEE, Mar. Fourth Interanational Workshop, pp. 2–9.

"Hardware–Software Codesign and GRAPE", by Marlee Adé et al., Rapid System Prototyping, Jun. 1999, Proceedings, Sixth IEEE International Workshop on Rapid System Prototyping, pp. 40–47.

"Object–Oriented Co–Synthesis of Distributed Embedded Systems", by Wayne Wolf, Proceedings of the ASP–DAC '95/VLSI '95, Design Automation Conference, Sep. 1995, pp. 553–558.

"An Architectural Co–Synthesis Algorithm for Distributed, Embedded Computing Systems", by Wayne H. Wolf, IEEE Transactions On Very Large Scale Integration (VLSI) Systems, vol. 5, No. 2, Jun. 1997, pp. 218–229.

* cited by examiner

FIG. 3

```
GENERATE_DYNAMIC_RECONFIGURATION(architecture,
task graphs){
  current_arch = architecture;
  previous_arch_cost = previous_arch_merge_potential = ∞;
  current_arch_merge_potential = number of PPEs;
  cuurent_arch_cost = cost of current_arch;
  while(current_arch_cost < previous_arch_cost OR
    current_arch_merge_potential <
    previous_arch_merge_potential){
    previous_arch_cost = current_arch_cost;
    previous_arch_merge_potential =
    current_arch_merge_potential;
    IDENTIFY_MERGE_TUPLES(current_arch,
    task graphs){
      for each PPE{calculate the merge potential
      with respect to rest of the PPEs;}
      for each PPE_i{PPE_i_tag = UNPAIRED;}
      for each unpaired PPE_j{
        merge array = NULL;
        inter_PPE_tuple (PPE_j, PPE_k) ← group PPE_j
        with one of the adjacent PPE, PPE_k, with
        which the merge potential is maximum;
        add inter_PPE_tuple (PPE_j, PPE_k) to merge_array;
        PPE_j_tag = PPE_k_tag = PAIRED;}
      for each element i of merge_array{i_tag = unexplored;}
    EXPLORE_MERGE(
        for each element j of merge_array{
          inter_PPE_merge_array ← identify the
          merge possibilities using architectural hints;
          j_tag = explored;}
        for each element k of
        the inter_PPE_merge_array{k_tag = unexplored;}
        for each element l of inter_PPE_merge_array{
          temp_arch ← current_arch is
          modified considering l;
          l_tag = explored;
          perform merge ← create additional mode
          for the FPGA and update download time;
          run scheduler;
          if (deadlines are met){
            current_arch = temp_arch;
            current_arch_merge_potential = number of
            PPEs + number of links in current_arch;}
        }
      }
    }
  }
  return final_arch = current_arch;
}
```

HARDWARE/SOFTWARE CO-SYNTHESIS OF DYNAMICALLY RECONFIGURABLE EMBEDDED SYSTEMS

CROSS-REFERENCES TO RELATED APPLICATIONS

This application claims the benefit of the filing date of U.S. provisional application No. 60/106,220, filed on Oct. 30, 1998. The subject matter of this application is related to the subject matter of U.S. patent application Ser. No. 09/024, 604 filed on Feb. 17, 1998 Ser. No. 09/024,605 filed on Feb. 17, 1998 Ser. No. 09/025,537 filed on Feb. 17, 1998 Ser. No. 09/024,839 filed on Feb. 17, 1998 Ser. No. 09/025, 097 filed on Feb. 17, 1998 Ser. No 09/024,762 filed on Feb. 17, 1998 No. 09/025,017 filed on Feb. 17, 1998 and Ser. No. 09/024, 846 filed on Feb. 17, 1998 the teachings of all of which are incorporated herein by reference.

BACKGROUND OF THE INVENTION

1. Field of the Invention

The present invention relates to the design of real-time distributed embedded systems, and, in particular, to the process of partitioning an embedded system specification into hardware and software modules using hardware-software co-synthesis.

2. Description of the Related Art

Embedded systems perform application-specific functions using central processing units (CPUs). They employ both general-purpose CPUs and application-specific integrated circuits (ASICs). ASICs can be based on standard cells, gate arrays, field-programmable gate arrays (FPGAs), or complex programmable logic devices (CPLDs). An embedded system architecture consists of hardware architecture and software architecture. The hardware architecture of an embedded system defines the interconnections of various hardware components. The software architecture defines the allocation of sequences of codes to specific general-purpose processors. Hardware/software co-synthesis is a process to obtain hardware and software architectures such that various embedded system constraints such as real-time, cost, power, etc., are met. Hardware/ software co-synthesis involves various steps such as allocation, scheduling, and performance estimation. Optimal hardware/software co-synthesis is known to be an NP-complete problem, where NP stands for non-deterministically polynomial. See Reference (1). Embedded systems employing reconfigurable hardware such as FPGAs and CPLDs are referred as reconfigurable embedded systems. Reconfigurable systems can provide higher performance as well as flexibility to adapt with changing system needs at low cost. See References (2)–(4). Dynamically reconfigurable embedded systems exploit reconfigurability of programmable devices at run-time to achieve further cost savings. With the availability of partially reconfigurable devices, dynamically reconfigurable systems have become viable. See References (5)–(8).

Co-synthesis of heterogeneous distributed systems has been previously addressed in References (9)–(24). Some of these co-synthesis systems (see References (12), (15), (16), (20), (23), and (24)) employ programmable devices such as FPGAs. However, none of these systems target dynamically reconfigurable embedded systems.

SUMMARY OF THE INVENTION

Dynamically reconfigurable embedded system architectures require reconfiguration of programmable hardware components such as FPGAs and CPLDs. These devices are either completely or partially reprogrammed at run-time to perform different functions at different times. Hardware/ software co-synthesis of dynamically reconfigurable architectures spans three major sub-problems: 1) delay management, 2) reconfiguration management, and 3) reconfiguration interface synthesis. Delay for a circuit through a programmable device varies depending on how the constituent circuit is placed and routed. Delay management techniques ensure that the delay constraint for the specific function is not exceeded while mapping the tasks to the programmable devices. Reconfiguration management techniques identify the grouping of tasks and their allocation such that the number of reconfigurations as well as time required for each reconfiguration are minimized while ensuring that real-time constraints are met. Reconfiguration interface synthesis determines an efficient interface for reprogramming programmable devices such that cost of the system is reduced while minimizing the reconfiguration time.

The present invention is related to a heuristic-based constructive co-synthesis algorithm, CRUSADE (Co-synthesis of ReconfigUrable System Architectures of Distributed Embedded systems) which optimizes the cost of the hardware architecture while meeting the real-time and other constraints.

The present invention addresses the co-synthesis of dynamically reconfigurable architectures. Fault-tolerant distributed embedded systems can offer high performance as well as dependability (reliability) and availability to meet the needs of critical real-time applications. The present invention can be easily extended to address the needs of fault-tolerant systems. In order to establish its effectiveness, CRUSADE has been successfully applied to several large real-life examples from mobile communication network base station, video distribution router, and telecom embedded systems.

In one embodiment, the present invention is a method for designing the architecture of an embedded system, comprising a pre-processing phase, a synthesis phase, and a reconfiguration phase. The pre-processing phase comprises the step of parsing one or more task graphs, one or more system/task constraints, and a resource library for the embedded system. The synthesis phase, following the pre-processing phase, comprises the step of allocating one or more groups of one or more tasks in the tasks graphs to one or more processing elements in the resource library and allocating one or more edges in the tasks graphs to one or more communication links in the resource library, based on performance evaluation of one or more possible allocations for each of the groups and edges in light of the system/task constraints, to generate a current version of the embedded system. The reconfiguration phase, following the synthesis phase, comprises the step of generating a reconfigurable version of the embedded system by merging at least two programmable PEs of the current version of the embedded system into a composite reconfigurable programmable PE having at least two modes of operation.

BRIEF DESCRIPTION OF THE DRAWINGS

Other aspects, features, and advantages of the present invention will become more fully apparent from the following detailed description, the appended claims, and the accompanying drawings in which:

FIG. 3 shows pseudo-code for generating a dynamic reconfiguration architecture corresponding to a given architecture;

Table 1 shows experimental results for delay management through FPGAs and CPLDs;

Table 2 shows experimental results demonstrating the efficacy of the CRUSADE system; and Table 3 shows experimental results demonstrating the efficacy of the CRUSADE-FT system.

DETAILED DESCRIPTION

Reconfigurable embedded systems offer potential for higher performance as well as adaptability to changing system requirements at low cost. Such systems employ reconfigurable hardware components such as FPGAs and CPLDs. These devices are programmed (customized) to support application-specific functions. A natural extension to the reconfigurable system is dynamically reconfigurable hardware, where programmable devices are dynamically reconfigured at run-time (execution) to enhance their utilization by virtue of their temporal sharing across multiple functions to further reduce embedded system hardware cost. Availability of partially reprogrammable devices have made dynamically reconfigurable embedded systems much more attractive. However, dynamic reconfiguration of programmable devices adds additional complexity to already complex co-synthesis problem due to the identification and management of multiple reconfiguration programs for each programmable device in the system architecture.

The present invention addresses the problem of hardware/software co-synthesis of dynamically reconfigurable embedded systems. The co-synthesis system CRUSADE takes as an input embedded system specifications in terms of periodic acyclic task graphs with rate constraints and generates dynamically reconfigurable heterogeneous distributed hardware and software architecture meeting real-time constraints while minimizing the system hardware cost. The group of tasks for dynamic reconfiguration of programmable devices is identified and efficient programming interfaces are synthesized for reconfiguring reprogrammable devices. Real-time systems require that the execution time for tasks mapped to reprogrammable devices are managed effectively such that real-time deadlines are not exceeded. To address this, a technique is proposed to effectively manage delay in reconfigurable devices. This technique guarantees that the real-time task deadlines are always met. The present co-synthesis algorithm can be easily extended to consider fault-detection and fault-tolerance.

Application of CRUSADE and its fault tolerance extension, CRUSADE-FT, to several real-life large examples (up to 7400 tasks) from mobile communication network base station, video distribution router, a multimedia system, and synchronous optical network (SONET) and asynchronous transfer mode (ATM) based telecom systems shows that up to 56% system cost savings can be realized.

Problem Description

Figure 1:
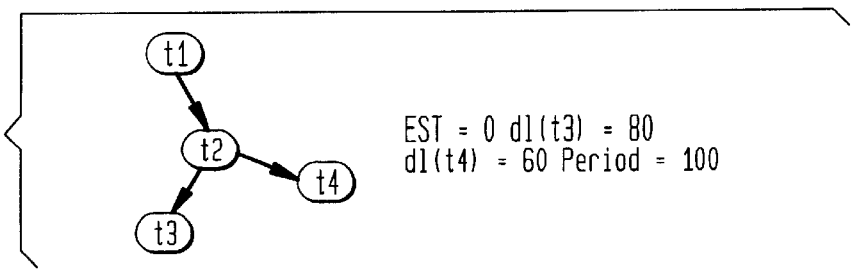
FIG. 1 shows an exemplary task graph.

The embedded system functionality is generally described through a set of acyclic task graphs. This task-based model is used in a variety of prior co-synthesis systems. See References (9), (21), (22), (23), (24). Nodes of a task graph represent tasks and a directed edge between two communicating tasks indicates communication. Tasks are atomic units performed by embedded systems. A task contains both data and control flow information. Task graphs are acyclic to reduce the complexity of the co-synthesis problem. However, there can be loops/cycles with a task. Each periodic task graph has an earliest start time (EST), a period, deadlines as shown in the example in FIG. 1.

A co-synthesis problem can be summarized as follows. Given embedded system specifications in terms of acyclic task graphs, the objective is to find the hardware and software architecture such that the architecture cost is minimum while making sure that all real-time constraints are met.

Co-Synthesis Framework

The architecture model: The CRUSADE co-synthesis system does not employ a pre-determined (fixed) architectural template since such an approach can result in an expensive architecture and may not be suitable for a variety of embedded systems. In the CRUSADE co-synthesis system, the resulting embedded system can have a heterogeneous distributed architecture employing different types of processing elements (PEs) and links, where the architectural topology is not determined a priori. In the resulting architecture, there can be more than one configuration program for each FPGA/CPLD. In other words, a given FPGA or CPLD can be time-shared among multiple functions, thereby requiring reprogramming and/or reconfiguration.

The resource library: Embedded system specifications are mapped to elements of a resource library, which consists of a PE library and a link library.

The PE library consists of various types of FPGAs, CPLDs, ASICs, and general-purpose CPUs. Each FPGA/CPLD (also referred as a programmable PE (PPE)) is characterized by (1) the number of gates/flip-flops/programmable functional units (PFUs), (2) the boot memory requirement, and (3) the number of pins, etc. Each ASIC is characterized by (1) the number of gates and (2) the number of pins. Each general-purpose processor is characterized by (1) the memory hierarchy information, (2) communication processor/port characteristics, and (3) the context switch time.

The link library consists of various types of links such as point-to-point, bus, and LAN. Each link is characterized by (1) the maximum number of ports it can support, (2) an access time vector which indicates link access times for different numbers of ports on the link, (3) the number of information bytes per packet, and (4) packet transmission time.

The execution model: Embedded system functions are specified by acyclic task graphs. Parameters used to characterize task graphs are described next. Each task is characterized by:

1. Execution time vector: This indicates the worst-case execution time of a task on the PEs in the PE library.
2. Preference vector: This indicates preferential mapping of a task on various PEs (such PEs may have special resources for the task).
3. Exclusion vector: This specifies which pairs of tasks cannot co-exist on the same PE (such pairs may create processing bottlenecks).
4. Memory vector: This indicates the different types of storage requirements for the task: program storage, data storage, and stack storage.

A cluster of tasks is a group of tasks which is always allocated to the same PE. Clustering of tasks in a task graph reduces the communication times and significantly speeds up the co-synthesis process. See Reference (23). Each cluster is characterized by the preference and exclusion vectors of its constituent tasks.

Each edge in the task graphs is characterized by:

1. The number of information bytes that need to be transferred.
2. Communication vector: This indicates the communication time for that edge on various links from the link library. It is computed based on link characteristics.

The communication vector for each edge is computed a priori. At the beginning of co-synthesis, since the actual number of ports on the links is not known, an average number of ports (specified beforehand) is used to determine the communication vector. This vector is recomputed after each allocation, considering the actual number of ports on the link.

In order to provide flexibility for the communication mechanism, two modes of communication are supported: (1) sequential where communication and computation cannot go on simultaneously and (2) concurrent where communication and computation can go on simultaneously if supported by the associated communication link and PEs.

Scheduling: CRUSADE uses a static scheduler that employs a combination of preemptive and non-preemptive scheduling to derive efficient schedules. Tasks and edges are scheduled based on deadline-based priority levels. The schedule for real-time periodic and aperiodic task graphs is defined during architecture synthesis.

Motivation For Reconfigurable Architectures

Reconfigurable architectures employ reconfigurable components such as FPGAs and/or CPLDs and are desirable for the following three major reasons.

(1) In spite of heavy emphasis on simulation and regression testing, occasionally, design errors are indeed detected after the design is introduced in the market. If such design errors are found to be in FPGAs or CPLDs, then these devices can be reprogrammed in the field to prevent large expenses associated with recall of products as well as design upgrades in the factory.

(2) Embedded system are generally released in the field with an initial set of functions/features. At a later date, additional features are often offered to the customer. If the reconfigurable devices in initial release have sufficient resources and required connectivity to support additional features and/or feature enhancements, it would be possible to provide the required upgrade by simply reconfiguring the FPGAs and CPLDs.

(3) Dynamic reconfiguration of FPGAs and CPLDs can result in low-cost architectures.

Figure 2:
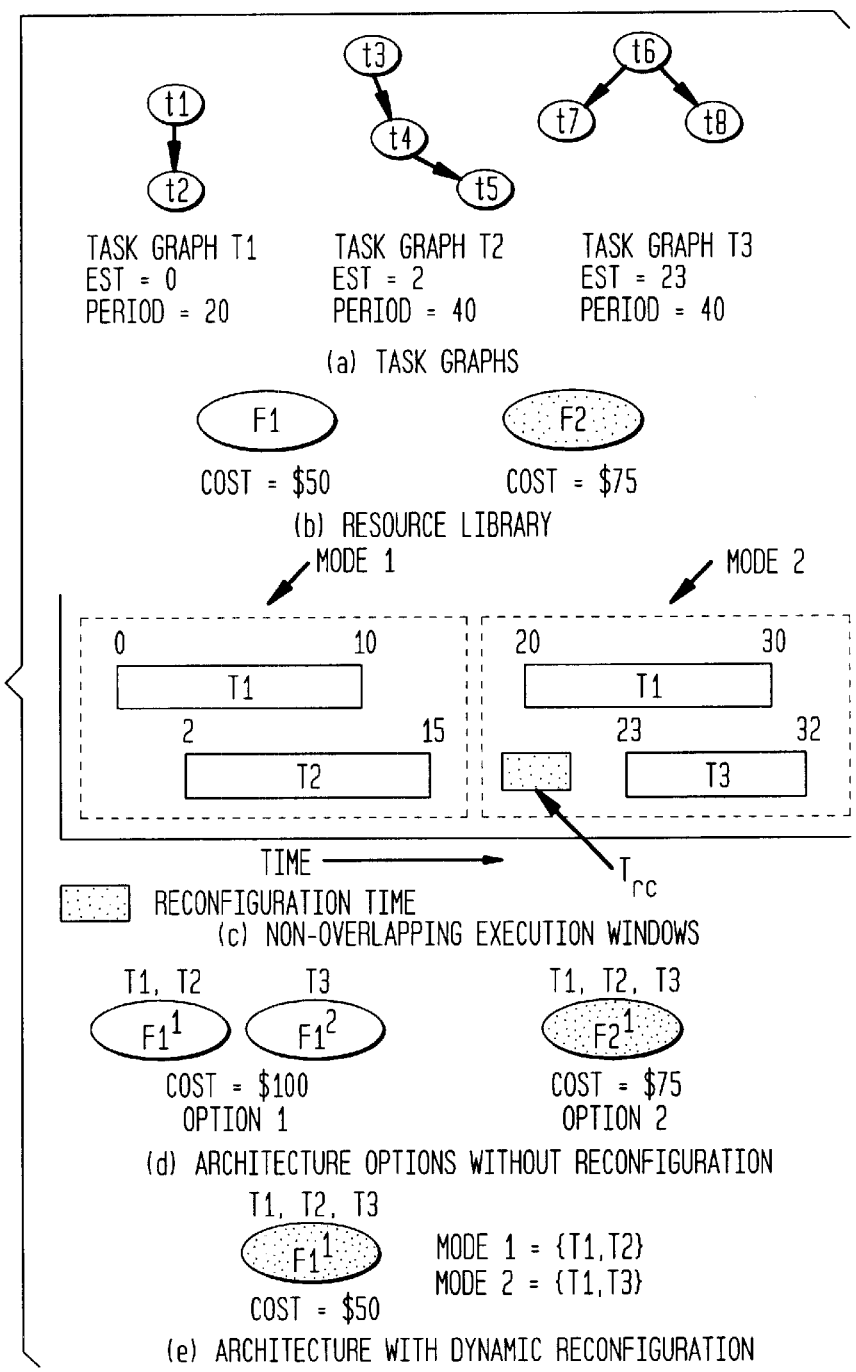
FIGS. 2(a)–(e) show an exemplary set of three task graphs, a resource library, execution windows, architecture options without reconfiguration, and an architecture with dynamic reconfiguration, respectively.

For example, assume that there are 3 task graphs T1, T2 and T3 required by embedded system functions as shown in FIG. 2(a). For simplicity, consider that the resource library has two FPGAs F1 and F2 as shown in FIG. 2(b). F1 can accommodate either T1 and T2 or T1 and T3, but not all three. Execution times of task graphs on the resource library is shown in FIG. 2(c). For simplicity, it is assumed here that execution times for each task graph are the same on both FPGAs. However, in reality, execution times will vary depending on the type of the FPGA. The hyperperiod $\Gamma$ is computed as the least common multiple of periods of all task graphs. In traditional real-time computing, if $P_i$ is period of task graph $T_i$, then $(\Gamma + P_i)$ copies are obtained for it. As shown in FIG. 2(c), the execution times of task graphs T2 and T3 never overlap. Further, only two of the three functions are required at any time in the hyperperiod. On the other hand, F2 can accommodate all three task graphs. Therefore, if reconfiguration of FPGAs is not employed, it would result in the two architecture options shown in FIG. 2(d). F1$^i$ is an $i^{th}$ instance of F1, and so on. If reconfiguration of FPGAs is employed, the architecture with one FPGA as shown in FIG. 2(e) would have been sufficient. In such an architecture, the FPGA will have two modes: mode 1 and mode 2. In mode 1, the F1$^i$ will support task graphs T1 and T2, whereas, in mode 2, F1$^i$ will support task graphs T1 and T3.

Co-Synthesis of Dynamically Reconfigurable Embedded Systems: Challenges and Solutions The following sections discuss challenges in the co-synthesis of dynamically reconfigurable embedded systems and techniques to address those challenges.

Identification of Non-Overlapping Task Graphs

Challenge: Reconfigurable embedded systems are characterized by a set of task graphs whose execution slots do not overlap in time and therefore offer opportunities of realizing cost-effective architectures by assigning multiple sets of task graphs to the same set of PPEs. The co-synthesis system needs to facilitate identification of such tasks graphs which can be assigned to the same PPEs.

Solution: In order to facilitate identification of non-overlapping task graphs, a compatibility vector is defined as follows.

Compatibility_vector of task graph $(T_i) = \{\Delta_{i1}, \Delta_{i2}, \ldots, \Delta_{ik}\}$ indicates compatibility of task graph $T_i$ with other task graphs of embedded system. $\Delta_{ij}$ indicates compatibility of task graph $T_i$ with task graph $_j$. If task graph $T_i$ is compatible with task graph $T_j$, then $\Delta_{ij}=0$; otherwise, $\Delta_{ij}=1$. If the execution times of two task graphs do not overlap, they are said to be compatible task graphs and they can FPGA/CPLD resources. If two task graphs are not compatible, it implies that their execution times do overlap and therefore independent sets of FPGA/CPLD resources must be assigned. Generally, during the task graph generation process, it is identified whether two task graphs are compatible with each other or not and that information relayed to the co-synthesis system by specifying the compatibility vector for each task graph. When compatibility vectors for task graphs are not specified, the co-synthesis system automatically identifies the non-overlapping task graphs based on start and stop times of tasks and edges following scheduling, using the procedure shown in FIG. 3.

For task graphs for which compatibility vectors are not specified, the CRUSADE system builds an architecture without requiring dynamic reconfiguration of the PPEs. Once the architecture is defined and deadlines are met, CRUSADE identifies the merge potential of the architecture as the summation of numbers of PPEs and links in the architecture. CRUSADE creates a merge array that includes the merge possibilities for each PPE. Each element of the merge array has a tuple that specifies a pair of PPEs that can be merged into a composite PPE with multiple modes resulting from dynamic reconfiguration. CRUSADE picks each tuple and explores a merge by creating multiple modes for the PPE and follows up with scheduling and finish time estimation. If deadlines are met, CRUSADE accepts the merge and uses the modified architecture. Otherwise, CRUSADE rejects the merge and explores the next merge from the merge array. Once all merges are explored, CRUSADE compares the modified architecture with the previous architecture. If the architecture cost or merge potential is decreasing, CRUSADE repeats the process. CRUSADE stops the process when it can no longer reduce the architecture cost or merge potential.

Allocation of Non-Overlapping Task Graphs

Challenge: Once the non-overlapping task sets are identified, their allocations need to be determined such that all real time constraints are met. During allocation, reconfiguration of a programmable device is considered to exploit temporal sharing of a programmable device across multiple functions.

Solution: During the allocation step, the CRUSADE system creates an allocation array which is an array of possible allocations at that point in the co-synthesis. The allocation array provides multiple versions of each programmable device. Each version corresponds to a different configuration of the device, which is also known as a mode of the device. A non-overlapping set of tasks is allocated to different versions (modes) of the device. Once the architecture is defined, CRUSADE merges the various versions of the device ensuring that real-time constraints are met.

Figure 4:
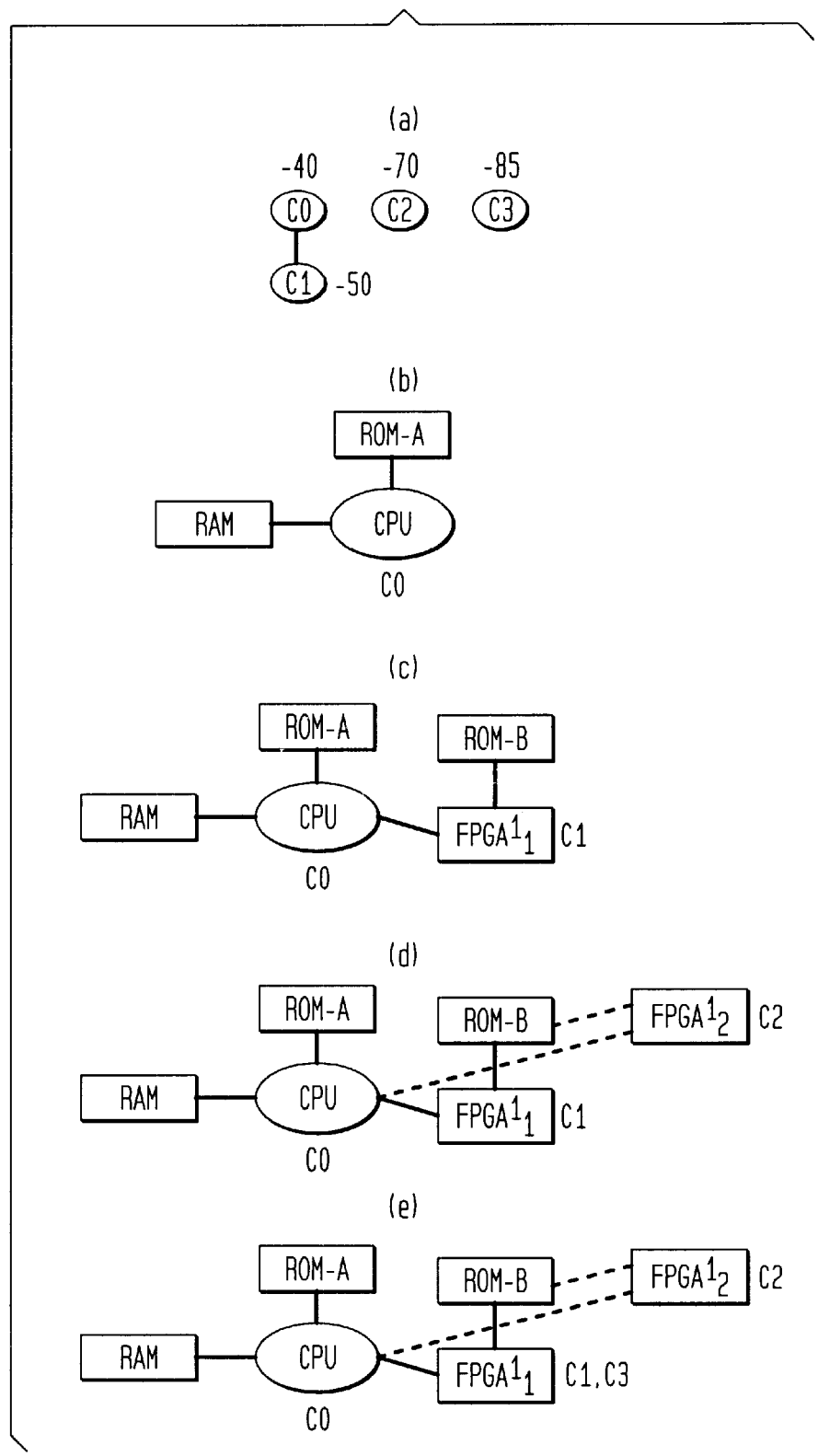
FIGS. 4 (a)–(e) show four clusters and four phases of allocating those clusters to PEs, respectively.

The following example is illustrative. A cluster is a group of tasks that are allocated to the same Clustering is performed to reduce allocation complexity and speed up the co-synthesis algorithm at minimal cost impact on the architecture. See Reference (23). Consider four clusters C0–C3 as shown in FIG. 4(a). Numbers next to clusters indicate their priority levels. Further, assume that clusters C1 and C2 are non-overlapping, i.e., the execution window of tasks from C1 do not overlap with tasks from C2. However, execution slots for tasks from C3 do overlap with those of cluster C1. Assume that clusters C1 through C3 require FPGAs. For allocation, higher priority task graphs are allocated first. Therefore, C0 is called for allocation first and the resulting partial architecture requiring CPU, RAM, and ROM-A is shown in FIG. 4(b). Next, cluster C1 is called for allocation. C1 requires addition of $FPGA^1_1$ and ROM-B for storing the associated programming interface as shown in FIG. 4(c). $FPGA^i_j$ indicates $i^{th}$ instance and $j^{th}$ mode of the FPGA. Next, cluster C2 is called for allocation assuming deadlines are met. If the deadlines are not met, CRUSADE explores the next possible allocation. Since C2 is non-overlapping with cluster C1, CRUSADE creates a new mode $FPGA^1_2$ as shown in FIG. 4(d). Assuming that the deadlines are met, CRUSADE calls cluster C3 for allocation. Cluster C3's execution slots do overlap with that of cluster C1, and therefore resources used for C1 can not be time-shared with C3. Hence, C3 is allocated to $FPGA^1_1$ to avoid a new mode, as shown in FIG. 4(e). Once all clusters are allocated, CRUSADE explores merging of modes. In other words, CRUSADE tries to combine C1, C2, and C3 in the same FPGA mode if there exists sufficient resources and deadlines are met. However, in this case, since it is not feasible, the architecture shown in FIG. 4(e) is the final architecture.

Management of Multiple Software Images

Challenge: As explained before, various modes of programmable devices are created to facilitate time-sharing of resources. Each of these modes requires a unique configuration software also known as a software image. Switching between modes requires reconfiguration of a device. The time required to reconfigure a device is called the boot time of the device. A co-synthesis system should take into consideration the time required to reprogram the device while checking whether the deadlines will be met.

Solution: In order to address this, each programmable device is characterized by a reboot_task. This task is added at the beginning in each mode. The time required for reboot_task is determined by the type (serial or parallel) and speed of the programming interface. The boot time of the device is taken into consideration while estimating the finish time of the tasks to check whether deadlines are met. For example, task $T_{pc}$ is added in front of T3 as shown in FIG. 2(c) to take into consideration time required for reconfiguration.

Synthesis of The Programming Interface

Challenge: FPGAs and CPLDs need to be programmed for correct operation. CPLDs are programmed via a standard test port used for boundary-scan testing. See Reference (5). There are two different types of programming modes for FPGAs: (1) serial and (2) 8-bit parallel. See References (6)–(8). Further, each of these modes can be configured to be either a master mode or a slave mode. The master mode is used when FPGAs are programmed from a stand-alone PROM. The slave mode is used when FPGAs are programmed via CPU. The master mode can be used on power-up, while the slave mode can be used in the field to provide upgrade of reconfiguration programs for bug fixes or providing a new set of features. Also, the speed of the programming interface can vary from 1 MHz to 10 MHz (current technology). Also, when multiple programmable devices are used, they are generally chained to reduce the cost of the programming interface and share the PROM used for storing the software image for various modes of various devices. The boot time of FPGAs/CPLDs can be as high as a few hundred milliseconds which can be of concern for real-time systems requiring mode changes. Thus, there are several factors that can determine the boot time for each device. Each of these options can impact the boot time as well as the cost and power of the system. Therefore, a hardware/software co-synthesis system should consider the above aspects while synthesizing the correct programming interface for the programmable device.

Solution: For each embedded system, its boot time requirement is specified. For each architecture option, a reconfiguration option array is created. Each element of the reconfiguration option array indicates various options for programming. Each option in the configuration option array is characterized by a boot time. Elements of the reconfiguration option array are ordered on the order of increasing dollar cost. CRUSADE chooses the one which has the lowest architecture cost while meeting the boot time requirements of the system. The boot time is recomputed based on the allocation and number of resources (CLBs/PFUs) that require reconfiguration.

Delay Management

Challenge: Generally, all logic blocks of programmable devices, such as FPGAs and CPLDs, are not usable due to routing restrictions. A very high utilization of PFUs and pins may force the router to route the nets in such a way that it may violate the delay constraint, i.e., the worst-case execution times defined by the execution time vector may be exceeded. Therefore, a hardware/software co-synthesis system should manage the delay through a programmable device such that the delay constraint used during scheduling is not exceeded.

Solution: In order to address this aspect, the CRUSADE system uses two parameters: (1) an effective resource utilization factor (ERUF) and (2) an effective pin utilization factor (EPUF) to control the variations in delay once the functions mapped to the programmable device are synthesized and routed. CRUSADE sets ERUF equal to 70% and EPUF equal to 80%. These percentages were derived based on existing designs and experimentally verified to guarantee the meeting of delay constraints during co-synthesis. Therefore, while allocating tasks to FPGAs/CPLDs, CRUSADE ensures that more than 70% of resources (PFUs/CLBs/Flipflops) and 80% of the pins are not utilized.

The CRUSADE Algorithm

Figure 5:
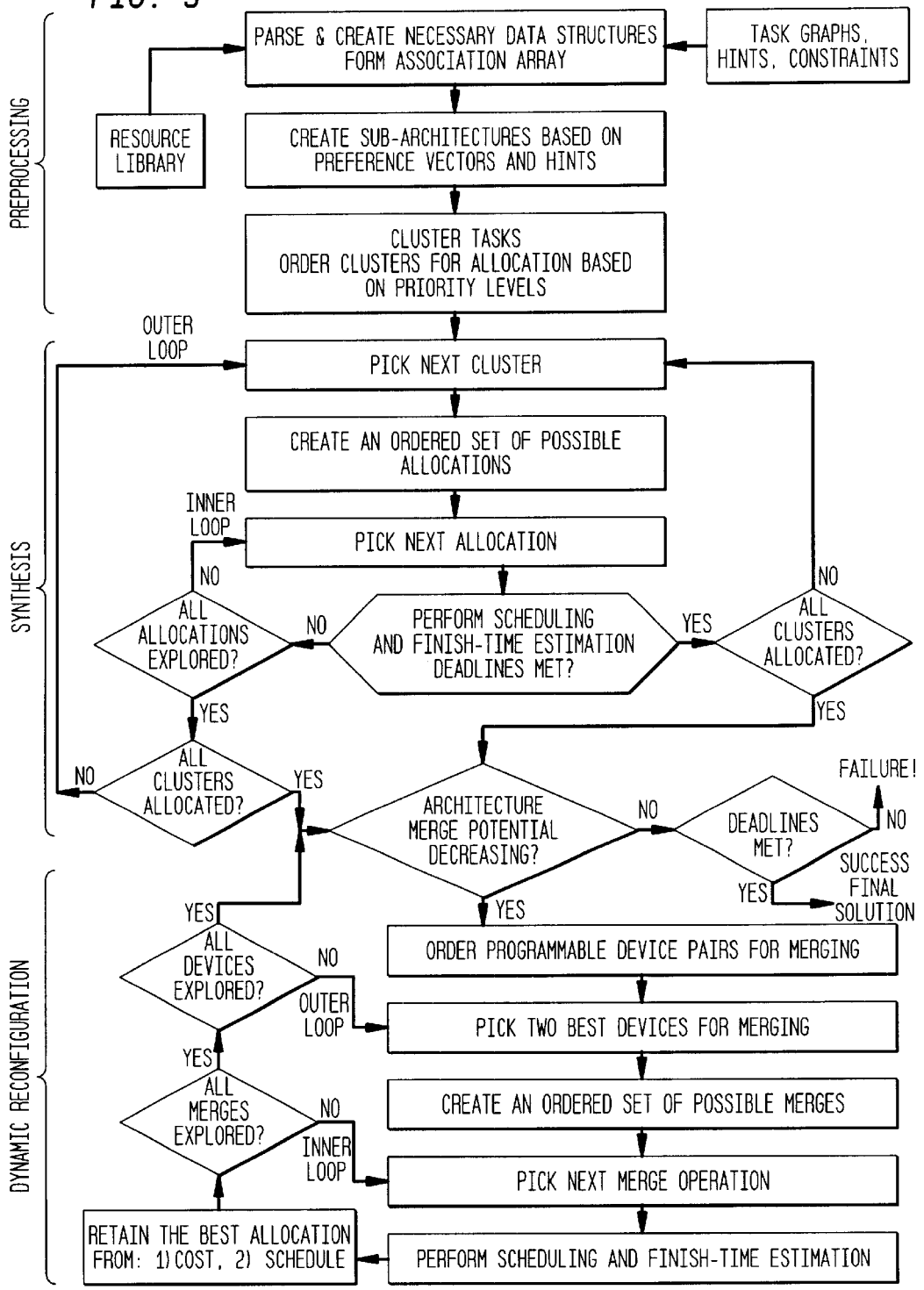
FIG. 5 the co-synthesis process flow, according to one embodiment of the present invention.

This section first provides an overview of the CRUSADE system and then follows up with details on each step. FIG. 5 presents a co-synthesis process flow, according to one embodiment of the present invention. This flow is divided up into three parts: pre-processing, synthesis, and dynamic reconfiguration generation. During pre-processing, CRUSADE processes the task graphs, system constraints, and resource library, and creates necessary data structures. In traditional real-time computing theory, if period, is the period of task graph i then (hyperperiod+$period_i$) copies are obtained for that task graph. See Reference (9). However, this is impractical from both a co-synthesis CPU time and memory requirements point of view, especially for multi-rate task graphs where this ratio may be very large. This problem is addressed by using the concept of the association array. See Reference (23). The clustering step involves the grouping of tasks to reduce the search space for the allocation step. See Reference (23). Tasks in a cluster get mapped to the same PE. This significantly reduces the overall complexity of the co-synthesis algorithm since allocation is part of its inner loop.

The synthesis step determines the allocation for both periodic and aperiodic task graphs. The synthesis part has two loops: (1) an outer loop for allocating each cluster and (2) an inner loop for evaluating various allocations for each cluster. For each cluster, an allocation array consisting of the possible allocations at that step is created. While allocating a cluster to a hardware module such as an ASIC or FPGA, it is made sure that the module capacity related to pin count, gate count, etc., is not exceeded. Similarly, while allocating a cluster to a general-purpose processor, it is made sure that the memory capacity of the PE is not exceeded. Inter-cluster edges are allocated to resources from the link library. Once the cluster is allocated, a programming interface for the reconfigurable devices is synthesized.

The next step is scheduling, which determines the relative ordering of tasks/edges for execution and the start and finish times for each task and edge. CRUSADE employs a combination of both preemptive and non-preemptive static scheduling. Preemptive scheduling is used in restricted scenarios to minimize scheduling complexity. For task preemption, CRUSADE takes into consideration the operating system overheads such as interrupt overhead, context-switch, remote procedure call (RPC), etc. through a parameter called preemption overhead. This information is experimentally determined and provided a priori. Incorporating scheduling into the inner loop facilitates accurate performance evaluation. Performance evaluation of an allocation is extremely important in picking the best allocation.

An important step of performance evaluation is finish-time estimation. In this step, with the help of the scheduler, the finish times of each task and edge are estimated using the longest path algorithm. See Reference (23). After finish-time estimation, it is verified whether the given deadlines in the task graphs are met. The allocation evaluation step compares the current allocation against previous ones based on total dollar cost of the architecture.

If deadlines are met, CRUSADE explores the merging of different modes of a programmable device during the dynamic reconfiguration generation phase.

The Association Array

CRUSADE uses the concept of the association array to eliminate the need for replicating task graphs. See Reference (23). Up to 13-fold reduction in Resynthesis CPU time is possible using this concept for medium-sized task graphs (with tasks numbering in hundreds) with less than 1% increase in embedded system cost.

An association array contains a limited amount of information for each copy of each task and facilitates fast scheduling. The association array not only eliminates the need to replicate the task graphs, but it also allows allocation of different task graph copies to different PEs, if desirable, to derive an efficient architecture. This array is created after task clustering, and is updated after scheduling. It also supports pipelining of task graphs, when necessary, to derive an efficient architecture. Concurrent instances of task graphs are allocated to the same set of PEs to achieve pipelining.

Task Clustering

Clustering involves the grouping of tasks to reduce the complexity of allocation. The present clustering technique addresses the fact there may be multiple longest paths through the task graph and the length of the longest path changes after partial clustering. CRUSADE uses the critical path task clustering method given in Reference (23.) In order to cluster tasks, CRUSADE first assigns deadline-based priority levels to tasks and edges using the procedure from Reference (23). The priority level of a task is an indication of the longest path from the task to a task with a specified deadline in terms of computation and communication costs as well as the deadline. In the beginning, when allocation is not defined, CRUSADE sums up the maximum execution and communication times along the longest path and subtracts the deadline from the sum to determine the priority levels. However, priority levels are recomputed after each allocation as well as task clustering steps. In order to reduce the schedule length, CRUSADE decreases the length of the longest path. This is done by forming a cluster of tasks along the current longest path. This makes the communication costs along the path zero. Then the process can be repeated for the longest path formed by the yet unclustered tasks, and so on. Task clustering results in up to three-fold reduction in co-synthesis CPU time for medium-sized task graphs with less than 1% increase in system cost.

Cluster Allocation

Once the clusters are formed, they are allocates to PEs. CRUSADE defines the priority level of a cluster as the maximum of the priority levels of the constituent tasks and incoming edges. Clusters are ordered based on decreasing priority levels. After the allocation of each cluster, CRUSADE recalculates the priority level of each task and cluster. CRUSADE picks the cluster with the highest priority level and creates an allocation array. This is an array of the possible allocations for a given cluster at that point in co-synthesis. It is formed considering preference vectors, upgrade of PEs, upgrade of links, addition of PEs and links, etc. Limiting the number of PEs and links that can be added at any step helps keep the allocation array size at manageable levels. CRUSADE orders the allocations in the allocation array in the order of increasing value of dollar cost. Once the allocation array is formed, CRUSADE uses the inner loop of co-synthesis to evaluate the allocations from this array. During this loop, CRUSADE picks the allocation with the least dollar cost and performs scheduling and allocation evaluation. If deadlines are met, CRUSADE picks the next cluster; otherwise, CRUSADE repeats the process with another allocation from the allocation array.

Scheduling and Performance Estimation

CRUSADE uses a priority-level based static scheduler for scheduling tasks and edges on all PEs and links in the allocation. CRUSADE usually needs to schedule the first copy of the task only. The start and finish times of the remaining copies are updated in the association array. However, CRUSADE does sometimes need to schedule the remaining copies. To determine the order of scheduling, CRUSADE orders tasks and edges based on the decreasing order of their priority levels. If two tasks (edges) have equal priority levels then CRUSADE schedules the task (edge) with the shorter execution (communication) time first. While scheduling communication edges, the scheduler considers the mode of communication (sequential or concurrent) supported by the link and the processor. Though preemptive scheduling is sometimes not desirable due to the overhead associated with it, it may be necessary to obtain an efficient architecture. The preemption overhead $\xi$ is determined experimentally considering the operating system overhead. It includes context switching and any other processor-specific overheads. Preemption of a higher priority task by a lower priority task is allowed only in the case when the higher priority task is a sink task which will not miss its deadline, in order to minimize the scheduling complexity. CRUSADE uses the finish-time estimation technique using the longest path algorithm from Reference (23) to estimate the finish times of all tasks with specified deadlines and checks whether their deadlines are met.

Allocation Evaluation

Each allocation is evaluated based on the total dollar cost. CRUSADE picks the allocation that at least meets the deadline in the best case. If no such allocation exists, CRUSADE picks an allocation for which the summation of the best-case finish times of all task graphs is maximum. The best-case finish time of a task graph is the maximum of the best-case finish times of the constituent tasks with specified deadlines. This generally leads to a less expensive architecture.

Dynamic Reconfiguration Generation

In this step, merging of programmable PEs such as FPGAs and CPLDs is done by creating multiple modes for some of the PPEs, using the procedure described earlier.

Co-Synthesis of Fault Tolerant Systems

Fault-tolerant distributed embedded systems can offer high performance as well as dependability (reliability and availability) to meet the needs of critical real-time applications. For best results, hardware-software co-synthesis of such systems should incorporate fault tolerance during the synthesis process itself. The CRUSADE system uses the concepts from Reference (24) to impart fault tolerance to the distributed embedded system architecture.

Fault tolerance is incorporated by adding assertion tasks and duplicate-and-compare tasks to the system followed by error recovery. An assertion task checks some inherent property/characteristic of the output data from the original task. If that property is not satisfied, it flags the output data as erroneous. Some common examples of assertion tasks used in communication systems are (a) parity error detection, (b) address range check, (c) protection switch-control error detection, (d) bipolar coding error detection, and (e) checksum error detection.

For each task, it is specified whether an assertion task is available or not. If not, the task is duplicated and the outputs of the two versions compared. For each assertion, an associated fault coverage is specified. It is possible that a single assertion is not sufficient to achieve the required fault coverage, and a combination of assertions is required. For each such task, a group of assertions and the location of each assertion is specified. For each check task (assertion or compare task), the weight of the communication edge between the checked task and check task and the execution vector of the check task is specified. If a task is capable of transmitting any error at its inputs to its outputs, it is said to be error-transparent. This property is quite common. CRUSADE exploits it to reduce the fault tolerance overhead.

In order to facilitate dependability analysis, the failure-in-time (FIT) rate and the mean time to repair (MTTR) are specified a priori for each hardware and software module. The FIT rate indicates the expected number of failures in $10^9$ hours of operation. Also, different functions of embedded systems can have different availability requirements. Therefore, the availability requirements are specified for each task graph in the specification. Error recovery is enabled through a few spare PEs. In the event of failure of any service module (a set of PEs grouped together for replacement), a switch to a standby module is made for efficient error recovery. The basic co-synthesis process of CRUSADE is also used in its extension for fault tolerance, termed CRUSADE-FT. The following describes how various steps are modified for fault tolerance.

Task clustering: CRUSADE-FT uses the clustering technique of Reference (24) which exploits the error transparency property and determines the best placement of assertion and/or duplicate-and-compare tasks. This procedure is also used while creating the sub-architecture based on preference vectors. CRUSADE-FT assigns the assertion overhead and fault tolerance level to each task. Priority levels are still used to identify the order of clustering for tasks. However, CRUSADE-FT uses fault tolerance levels to cluster the tasks.

Inner loop of co-synthesis: For each allocation, in addition to the finish-time estimation, CRUSADE-FT explores whether any assertions need to be added, removed, or shared following scheduling. CRUSADE-FT also obtains the service modules from the architecture using architectural hints (if available; otherwise, using an automated process as described in Reference (24)) and task graph availability requirements. Markov models are used to evaluate the availability of service modules and the distributed architecture.

Dynamic reconfiguration generation: While evaluating each possible PPE merge, CRUSADE-FT also performs (1) addition/removal of assertions, as necessary, to reduce the fault tolerance overhead and (2) dependability analysis to ensure that the resulting architecture continues to meet the availability constraints.

Experimental Results

The co-synthesis algorithms CRUSADE and CRUSADE-FT have been implemented in C++. In order to test efficacy of the delay management technique through programmable PEs, a series of experiments were run varying EPUF and ERUF from 70% to 100% while observing the impact on the delay constraint of various functional blocks. Sample results are shown in Table 1. It was observed that while setting EPUF=80% and ERUF=70%, delay constraints used for various functional blocks during co-synthesis process was not violated when those functions are actually synthesized with other functions on a device.

CRUSADE was also run on communication system task graphs. These are large task graphs representing real-life field applications. These task graphs contain tasks from a digital cellular communication network base station, a video distribution router (video encoding/decoding using MPEG standard), a synchronous optical network (SONET) interface processing, an asynchronous transfer mode (ATM) cell processing, digital signal processing, provisioning, transmission interfaces, performance monitoring, protection switching, etc. These task graphs have wide variations in their periods ranging from 25 microseconds to 1 minute. The execution times were either experimentally measured or estimated based on existing designs.

The general-purpose processors in the resource library had the real-time operating system pSOS+ running on them.

The execution times included the operating system overhead. For results on these graphs, the PE library was assumed to contain Motorola microprocessors 68360, 68040, 68060, Power QUICC (each processor with and without a 256 KB second-level cache), 16 ASICs, XILINX 3195A, 4025, and 6700 series FPGAs, ATMEL AT6000 series FPGAs, XILINX XC9500 and XC7300 CPLDs, one ORCA 2T 15, and 2T40 FPGAs. For each general-purpose processor, four DRAM banks providing up to 64 MB capacity were evaluated. DRAM devices with 60-ns access time were used. The link library was assumed to contain a 680X0 and Power QUICC buses, a 10 Mb/s LAN, and a 31 Mb/s serial link.

Table 2 shows the experimental results. The first major column in this table gives characteristics of the distributed architecture derived by CRUSADE without employing dynamic reconfigurations of programmable devices, i.e., each programmable device had only one mode. The CPU times are on Sparcstation 20 with 256 MB of DRAM. The system cost is the summation of the costs of the constituent PEs and links. The second major column gives the results with CRUSADE employing multiple modes for each of the programmable devices to time share the resources to reduce the cost. CRUSADE can realize up to 56% cost savings by employing dynamic reconfiguration of programmable devices.

For experiments with CRUSADE-FT, the FIT rates for various modules were either based on the existing designs or estimated using Bellcore guidelines. See Reference (25). The mean time to repair (MTTR) was assumed to be two hours. The unavailability requirements for task graphs providing provisioning and transmission functions were assumed to be 12 minutes/year and 4 minutes/year, respectively. The results with CRUSADE-FT are shown in Table 3. CRUSADE-FT can realize up to 53% cost savings by employing dynamic reconfiguration of programmable devices while deriving fault tolerant architectures. Although the CRUSADE and CRUSADE-FT system have been designed to generated dynamically reconfigurable embedded systems, it will be understood that non-dynamically reconfigurable embedded systems can also be generated using the techniques of the present invention.

CONCLUSIONS

The present invention provides an efficient co-synthesis algorithm for synthesizing dynamically reconfigurable heterogeneous distributed real-time embedded system architectures. Experimental results on various large real-life examples are very encouraging. Fault tolerance considerations can be incorporated into the present algorithm. For this case as well, the efficacy of algorithm was established through experimental results.

REFERENCES

The following references are incorporated herein by reference:

(1) M. R. Garey and D. S. Johnson, *Computers and Intractability: A Guide to the Theory of NP -Completeness*, W. H. Freeman and Co., 1979.
(2) B. L. Hutchings and M. J. Wirthlin, "Implementation approaches for reconfigurable logic applications," in *Field Programmable Logic and Applications*, Springer, Oxford, England, pp. 419–428, August 1995.
(3) J. E. Vuillemin, et. al., "Programmable active memories: Reconfigurable systems come of age," *IEEE Trans. VLSI Sys.*, vol. 4, pp. 56–69, March 1996.
(4) P. Athanas and K. L. Pocek, eds., *Proceedings The IEEE, Symposium on FPGAs for Custom Computing Machines*, IEEE Computer Society Press, April 1995.
(5) XILINX: *The ISP application guide and CPLD data book*, May 1997.
(6) XILINX Inc., *XC6200 Field Programmable Gate Arrays*, April 1997.
(7) Atmel Corporation, *Configurable Logic Design and Application Book*, August 1995.
(8) Lucent Technologies, *FPGA data book*, October, 1996.
(9) D. Kirovski and M. Potkonjak, "System-level synthesis of low-power hard real-time systems," in *Proc. Design Automation Conf.*, pp. 697–702, June 1997.
(10) R. K. Gupta, Co-Synthesis of Hardware and Software for Digital Embedded Systems, Kluwer Academic Publishers, Norwell, Mass., 1995.
(11) J. Henkel and R. Ernst, "A hardware/software partitioner using a dynamically determined granularity," in *Proc. Design Automation Conf.*, pp. 691–696, June 1997.
(12) K. V. Rompaey et al., "CoWare—A design environment for heterogeneous hardware/software systems," in *Proc. European Design Automation Conf.*, pp. 252–257, September 1996.
(13) F. Vahid and D. Gajski, "Incremental hardware estimation during hardware/software functional partitioning," *IEEE Trans. VLSI Systems*, vol. 3, no.3, pp.459–464, September 1995.
(14) A. Kalavade and E. A. Lee, "The extended partitioning problem: Hardware/software partitioning and implementation-bin selection," in *Proc. Intl Wkshp. Rapid Prototyping*, June 1995.
(15) A. Kalavade and P. A. Subrahmanyam, "Hardware/software partitioning for multi-function systems," in *Proc. Int. Conf. Computer-Aided Design*, pp. 516–521, November 1997.
(16) F. Balarin et al., *Hardware-Software co-synthesis of Embedded Systems:* The POLIS Approach, Kluwer Academic Publishers, Boston, Mass., 1997.
(17) M. B. Srivastava and R. W. Brodersen, "SIERA: A unified framework for rapid-prototyping of system-level hardware and software," *IEEE Trans. Computer-Aided Design*, pp. 676–693, June 1995.
(18) D. D. Gajski, F. Vahid, S. Narayan, and J. Gong, "SpecSyn: An environment supporting the specify-explore-refine paradigm for hardware/software system design," Tech. Report CS-96-08, University of California, Riverside, Calif., September 1996.
(19) J. Buck, S. Ha, E. A. Lee, and D. G. Messerschmitt, "Ptolemy: A framework for simulating and prototyping heterogeneous systems," *Int. J. Comp. Simulation*, January 1994.
(20) K. Buchenrieder and C. Veith, "A prototyping environment for control-oriented HW/SW systems using statecharts, activity charts and FPGA's," in *Proc. European Design Automation Conf.*, pp. 60–65, September 1994.
(21) S. Prakash and A. Parker, "SOS: Synthesis of application-specific heterogeneous multiprocessor systems," *J. Parallel & Distributed Comput.*, vol. 16, pp. 338–351, December 1992.
(22) T.-Y. Yen and W. Wolf, "Communication synthesis for distributed embedded systems,"in *Proc. Int. Conf Computer-Aided Design*, pp. 288–294, November 1995.
(23) Authors names removed for blind review, "COSYN: Hardware-software co-synthesis of distributed embedded systems," in *Proc. Design Automnation Conf.*, pp. 703–708, June 1997.
(24) Authors name removed for blind review, "COFTA: Hardware-software co-synthesis of heterogeneous distributed embedded system architectures for low overhead fault tolerance," in *Proc. Int. Symp. Fault-Tolerant Computing*, pp. 339–348, June 1997.

(25) Bellcore, "Generic reliability requirements for fiber optic transport systems," Tech. Ref. TR-NWT-00418, December 1992.

While the exemplary embodiments of the present invention have been described with respect to processes of circuits, the present invention is not so limited. As would be apparent to one skilled in the art, various functions of circuit elements may also be implemented in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented method for designing the architecture of an embedded system, comprising:
   (a) a pre-processing phase comprising the step of parsing one or more task graphs, one or more system/task constraints, and a resource library for the embedded system;
   (b) a synthesis phase, following the pre-processing phase, comprising the step of allocating one or more groups of one or more tasks in the tasks graphs to one or more processing elements (PEs) in the resource library and allocating one or more edges in the tasks graphs to one or more communication links in the resource library, based on performance evaluation of one or more possible allocations for each of the groups and edges in light of the system/task constraints, to generate a current version of the embedded system; and
   (c) a reconfiguration phase, following the synthesis phase, comprising the step of generating a reconfigurable version of the embedded system by merging at least two programmable PEs of the current version of the embedded system into a composite reconfigurable programmable PE having at least two modes of operation.

2. The invention of claim 1, wherein the reconfiguration phase comprises the steps of:
   (1) for the current version of the embedded system, generating an ordered set of pairs of programmable PEs for possible merging;
   (2) for each pair of programmable PEs in the order set:
      (i) merging the pair of programmable PEs into a composite programmable PE having at least two modes of operation to form a temporary version of the embedded system; and
      (ii) performing scheduling and finish-time estimation for the temporary version of the embedded system comprising the composite programmable PE; and
   (3) comparing the current version and all temporary versions of the embedded systems to select a best version to generate an updated current version of the embedded system.

3. The invention of claim 2, wherein steps (1)–(3) are repeated until the number of PEs in the current version of the embedded system remains unchanged to generate the reconfigurable version of the embedded system.

4. The invention of claim 2, wherein the best version is selected based on consideration of at least one of cost and schedule.

5. The invention of claim 1, wherein the reconfiguration phase is based on an identification of non-overlapping task graphs.

6. The invention of claim 1, wherein the reconfiguration phase synthesizes a programming interface that controls reconfiguration of the composite reconfigurable programmable PE between different modes of operation.

7. The invention of claim 6, wherein the synthesis of the programming interface takes into account optimization of at least one of speed, type, dollar cost, and power dissipation of the programming interface.

8. The invention of claim 1, wherein the reconfiguration phase takes into account time needed to reconfigure the composite reconfigurable programmable PE between different software images corresponding to different modes of operation.

9. The invention of claim 1, wherein the reconfiguration phase takes into account effects that different functions implemented on the composite reconfigurable programmable PE have on one another.

10. The invention of claim 9, wherein the reconfiguration phase uses an effective resource utilization factor (ERUF) and an effective pin utilization factor (EPUF) to control variations in delay for synthesizing and routing the different functions on the composite reconfigurable programmable PE.

11. The invention of claim 1, wherein the composite programmable PE is dynamically reconfigurable in the reconfigurable version of the embedded system.

12. The invention of claim 1, wherein the composite programmable PE is an FPGA or a CPLD.

13. The invention of claim 1, wherein:
   the pre-processing phase further comprises the step of assigning one or more fault detection tasks to one or more original tasks in the tasks graphs; and
   the synthesis phase takes into account the fault detection tasks in order to generate, in the reconfiguration phase, a fault-tolerant reconfigurable embedded system that can perform fault detection for the one or more original tasks.

14. An embedded system having an architecture generated using the method of claim 1.

15. A computer system for designing the architecture of an embedded system, comprising:
   (a) means for implementing a pre-processing phase comprising the step of parsing one or more task graphs, one or more system/task constraints, and a resource library for the embedded system;

(b) means for implementing a synthesis phase, following the pre-processing phase, comprising the step of allocating one or more groups of one or more tasks in the tasks graphs to one or more processing elements (PEs) in the resource library and allocating one or more edges in the tasks graphs to one or more communication links in the resource library, based on performance evaluation of one or more possible allocations for each of the groups and edges in light of the system/task constraints, to generate a current version of the embedded system; and (c) means for implementing a reconfiguration phase, following the synthesis phase, comprising the step of generating a reconfigurable version of the embedded system by merging at least two programmable PEs of the current version of the embedded system into a composite reconfigurable programmable PE having at least two modes of operation.

* * * * *